US007314699B2

(12) United States Patent
Gries

(10) Patent No.: US 7,314,699 B2
(45) Date of Patent: Jan. 1, 2008

(54) RADIATION-SENSITIVE MIXTURE AND RECORDING MATERIAL PRODUCED THEREWITH

(75) Inventor: Willi-Kurt Gries, Mainz-Kastel (DE)

(73) Assignee: Agfa Graphics NV, Mortsel (BE)

( * ) Notice: Subject to any disclaimer, the term of this patent is extended or adjusted under 35 U.S.C. 154(b) by 16 days.

(21) Appl. No.: 10/425,158

(22) Filed: Apr. 29, 2003

(65) Prior Publication Data

US 2003/0215744 A1 Nov. 20, 2003

Related U.S. Application Data

(60) Provisional application No. 60/390,988, filed on Jun. 24, 2002.

(30) Foreign Application Priority Data

Apr. 29, 2002 (EP) .................................. 02100424

(51) Int. Cl.
*G03F 7/00* (2006.01)
*G03F 7/004* (2006.01)

(52) U.S. Cl. ................ 430/270.1; 430/945; 430/281.1; 430/905; 430/913; 430/915

(58) Field of Classification Search ............. 430/270.1, 430/273.1, 302
See application file for complete search history.

(56) References Cited

U.S. PATENT DOCUMENTS 5,494,777 A * 2/1996 Shiraki et al. ........... 430/270.1

FOREIGN PATENT DOCUMENTS

| | | | | |
|---|---|---|---|---|
| EP | 0 315 988 | A2 | | 5/1989 |
| EP | 0 369 645 | A1 | | 5/1990 |
| EP | 0 441 542 | A1 | | 8/1991 |
| EP | 0 563 925 | A1 | | 10/1993 |
| EP | 1 106 381 | A1 | | 6/2001 |
| EP | 1 162 078 | A2 | | 12/2001 |
| EP | 1 176 007 | A2 | | 1/2002 |
| EP | 1 203 660 | A1 | | 5/2002 |
| EP | 1 223 196 | A2 | | 7/2002 |
| JP | 2002166669 | A | * | 6/2002 |
| JP | 2002202592 | A | * | 7/2002 |

OTHER PUBLICATIONS

English language abstract of JP 2002-16669.*
English language abstract of JP 2002-202592.*
Search Report for EP 02 10 0424 (Sep. 27, 2002).

* cited by examiner

*Primary Examiner*—Amanda C. Walke
(74) *Attorney, Agent, or Firm*—Leydig, Voit & Mayer, Ltd.

(57) ABSTRACT

The present invention relates to a radiation-sensitive mixture which contains an acrylate or methacrylate monomer and/or oligomer capable of free radical polymerization and having at least two acrylate and/or methacrylate groups and at least one photooxidizable group, a photoinitiator, an organic polymeric binder and a heptamethinecyanine dye acting as an IR-absorbing dye. It furthermore relates to a recording material comprising a substrate and a photopolymerizable layer and a process for the production of a printing plate from this recording material. The recording material is distinguished by suitable photosensitivity.

21 Claims, No Drawings

RADIATION-SENSITIVE MIXTURE AND RECORDING MATERIAL PRODUCED THEREWITH

This application claims the benefit of U.S. Provisional Patent Application No. 60/390,988, filed Jun. 24, 2002, which is hereby incorporated by reference.

FIELD OF THE INVENTION

The present invention relates to a radiation-sensitive (photopolymerizable) mixture comprising a polymeric binder, a component capable of free radical polymerization, an infrared absorber and a triazine. It furthermore relates to a recording material comprising a substrate and a radiation-sensitive layer.

BACKGROUND OF THE INVENTION

A mixture of the type stated at the outset has already been described in EP-A 0 369 645. It comprises a monomer capable of free radical polymerization and a photoinitiator system which is soluble therein and contains a trihalomethyl-substituted 1,3,5-triazine, a sensitizer for the triazine and an electron donor compound having an oxidation potential greater than zero and less than that of 1,4-dimethoxybenzene. The sensitizers mentioned are coumarin, xanthene, acridine, thiazole, thiazine, oxazine, azine, aminoketone, methine and polymethine dyes, porphyrins, aminotriarylmethanes, merocyanines, squarylium and pyridinium dyes. They are sensitive in particular to radiation in the range from 350 to 700 nm. For radiation in the near IR range (700 to 1 200 nm), on the other hand, the sensitivity is only low.

Furthermore, EP-A 0 315 988 discloses a photopolymerizable mixture which is sensitive to radiation in the range from 600 to 700 nm. It comprises a polymerizable, ethylenically unsaturated compound, a free radical former and a substituted 2-phenyl-2H-naphtho[6,5,4-a,m,n]thioxanthene-1,3-dione or a substituted 3-alkoxy-2-phenyl-naphtho[6,5,4-a,m,n]thioxanthen-1-one as a sensitizer.

EP-A 0 441 542 relates to a composition crosslinking on irradiation and comprising a polymer to which mono-, di- or trihalomethyl-substituted [1,3,5]triazine radicals are covalently bonded via a bridging group. The base polymer can be selected from a large number of polymers. It may be, for example, a polyamide, a polyester, a polyurethane, polysiloxane, a phenol resin, a polystyrene, a polyacrylate, a polyacrylic acid, a polyacrylamide, a polyacrylonitrile, a polyethylene, a polybutadiene, polyvinylpyrrolidone, polycaprolactone, gelatin, starch or a polysaccharide.

EP-A 0 563 925 discloses a photopolymerizable mixture which comprises a monomer capable of free radical polymerization, a substituted 2-phenyl-4-halomethyl- (or 4,6-bishalomethyl)-[1,3,5]triazine and a compound which acts as a sensitizer for the triazine. The mixture is used for the production of negative-working printing plates.

A directly imagable recording material for the production of planographic printing plates is described in EP-A 1 106 381. It comprises an electrochemically grained substrate of a special aluminum alloy and a photosensitive layer which contains an IR absorber and a water-insoluble but alkali-soluble polymeric binder.

The recording material directly imagable by means of UV, VIS or IR laser radiation and intended for the production of offset printing plates according to EP-A 1 091 247 comprises a photosensitive layer which contains a monomer having one or more polymerizable, substituted acrylate group(s) or derivatives thereof and a photopolymerization initiator. In the α-position relative to the polymerizable double bond of the monomer, there is always a hetero atom or a halogen atom. Preferred initiators are aromatic ketones, aromatic onium salts, organic peroxides, hexaarylbisimidazoles, borates, metallocenes and compounds having carbon-halogen bonds. The last-mentioned may also include substituted [1,3,5]triazines having trihalomethyl groups. The photosensitive layer may also contain sensitizer dyes. A polyvinyl alcohol layer may additionally be present on the photosensitive layer. An important disadvantage of this recording material is that the monomers are difficult to synthesize and hence correspondingly expensive. Furthermore, the reactivity and hence the photosensitivity of the layer are reduced.

OBJECTS OF THE INVENTION

It is an object of the present invention to provide a radiation-sensitive mixture and a recording material, which contains monomers which are obtainable in a simple manner and are as far as possible commercially available and has improved photosensitivity compared with the prior art.

SUMMARY OF THE INVENTION

The object is achieved by a radiation-sensitive mixture which contains a heptamethinecyanine dye absorbing in the range from 700 to 1 200 nm and acrylate and/or methacrylate monomers having at least one photooxidizable group.

The present invention accordingly relates to a radiation-sensitive mixture which contains an acrylate or methacrylate monomer and/or oligomer capable of free radical polymerization and having at least two acrylate and/or methacrylate groups and at least one photooxidizable group, a photoinitiator, an IR-absorbing dye and an organic polymeric binder, wherein the IR-absorbing dye is a heptamethinecyanine dye.

Heptamethinecyanine dyes in which 3 methine carbon atoms are part of a 5- to 7-membered isocyclic or heterocyclic ring are preferred. The term "heptamethinecyanine dyes" includes amphoteric and ionic compounds. The aromatic terminal groups in the dyes are preferably indole or indolium groups to which further rings, in particular carbocyclic rings, may optionally be fused.

The binder may be selected from a whole range of organic polymers. Mixtures of different binders can also be used. For example, chlorinated polyalkylenes (in particular chlorinated polyethylene and chlorinated polypropylene), alkyl or alkenyl poly(meth)acrylates (in particular polymethyl (meth)acrylate, polyethyl (meth)acrylate, polybutyl (meth) acrylate, polyisobutyl (meth)acrylate, polyhexyl (meth) acrylate, poly[(2-ethylhexyl) (meth)acrylate] and poly[allyl (meth)acrylate]), copolymers of alkyl or alkenyl (meth) acrylates with other copolymerizable monomers (in particular with (meth)acrylonitrile, vinyl chloride, vinylidene chloride, styrene and/or butadiene), polyvinyl chloride (PVC), vinyl chloride/acrylonitrile copolymers, polyvinylidene chloride (PVDC), vinylidene chloride/acrylonitrile copolymers, polyvinyl acetate, polyvinyl alcohol, polyacrylonitrile, acrylonitrile/styrene copolymers, (meth)acrylamide/alkyl (meth)acrylate copolymers, acrylonitrile/butadiene/styrene (ABS) terpolymers, polystyrene, poly(α-methylstyrene), polyimides, polyurethanes, polyesters, methylcellulose, ethylcellulose, acetylcellulose, (hydroxy-(C1-C4)alkyl)-cellulose, carboxymethylcellulose, polyvinylformal and polyvinylbutyral are suitable. Particularly suitable binders are those which are insoluble in water but soluble or at least swellable in aqueous alkaline solutions. Those polymers which are soluble in the customary organic coating solvents are expediently chosen for this purpose.

For the purposes of the present invention, binders which contain carboxyl groups are particularly suitable. These are in particular copolymers having units of α,β-unsaturated carboxylic acids or dicarboxylic acids (preferably acrylic acid, methacrylic acid, crotonic acid, vinylacetic acid, maleic acid or itaconic acid). Copolymers having units of (meth)acrylic acid and units of alkyl (meth)acrylates, allyl methacrylates and/or (meth)acrylonitrile may be mentioned in particular, as well as copolymers having units of crotonic acid and units of alkyl (meth)acrylates and/or (meth)acrylonitrile, and finally also vinylacetic acid/alkyl (meth)acrylate copolymers. Copolymers having units of maleic anhydride or monoalkyl maleates are also suitable. These include, for example, copolymers having units of maleic anhydride and styrene, substituted styrenes, unsaturated ethers or esters or unsaturated aliphatic hydrocarbons, and the esterification products obtainable from such copolymers. Products which form from the reaction of polymers containing hydroxyl groups with intramolecular dicarboxylic anhydrides may furthermore be mentioned. The term "copolymers" is to be understood here as meaning polymers having units of at least two different monomers, i.e. also terpolymers and higher copolymers. It is also possible to use polymers in which groups having acidic hydrogen atoms occur, some or all of which are reacted with activated isocyanates. These include, for example, products as formed in the reaction of polymers containing hydroxyl groups with aliphatic or aromatic sulfonyl isocyanates or phosphinic acid isocyanates. Finally, polymers having aliphatic or aromatic hydroxyl groups, for example copolymers having units of hydroxyalkyl (meth)acrylates, of allyl alcohol, of hydroxystyrene or of vinyl alcohol, and epoxy resins, provided that they carry a sufficient number of free OH groups, are also suitable.

In the context of the present invention, the term "(meth) acrylic acid" represents "acrylic acid and/or methacrylic acid". The same applies to (meth)acrylonitrile, (meth)acrylate, (meth)acrylamide, etc.

The organic polymers used as binders generally have an average molecular weight Mw of from 600 to 200 000, preferably from 1 000 to 100 000. Polymers which have an acid number of from 10 to 250, preferably from 20 to 200, or a hydroxyl number of from 50 to 750, preferably from 100 to 500, are furthermore preferred.

The amount of binder(s) is in general from 10 to 90% by weight, preferably from 20 to 80% by weight, based in each case on the total weight of the nonvolatile components of the radiation-sensitive mixture.

The acrylate or methacrylate compound capable of free radical polymerization and having at least one photooxidizable group is, for example, a compound having a primary, secondary and in particular tertiary amino group. Polymerizable compounds which also contain at least one urea and/or urethane group in addition to a (tertiary) amino group are particularly preferred. In the context of the present invention, the term "urea group" is to be understood as meaning a group of the formula >N—CO—N< in which the valences on the nitrogen atoms are saturated with hydrogen atoms or hydrocarbon radicals (not more than one valence on each of the two nitrogen atoms should be saturated with a hydrogen atom). However, it is also possible for a valence on a nitrogen atom to produce the bond to a carbamoyl group (i.e. a —CO—NH group), so that a biuret structure forms.

In addition, compounds which have a photooxidizable amino, urea or thio group, which may also be part of a heterocyclic ring, are suitable. Compounds having photooxidizable enol groups are likewise suitable. Specific examples of photooxidizable groups are triethanolamino, triphenylamino, thiourea, imidazole, oxazole, thiazole, acetylacetonyl, N-phenylglycine and ascorbic acid groups. Particularly suitable monomers having photooxidizable groups can be described by the following formula I $$R_{(m-n)}Q[(—CH_2—CR^1R^2—O)_a—CO—NH—(X^1—NH—CO—O)_b—X^2—(O—CO—CR^3{=}CH_2)_c]_n \quad (I)$$

in which

Q represents —S—,

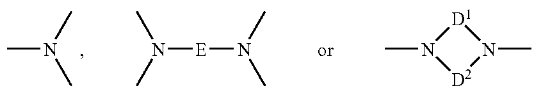

R represents a $(C_2\text{-}C_8)$alkyl-, $(C_2\text{-}C_8)$hydroxyalkyl or $(C_6\text{-}C_{14})$aryl group, $R^1$ and $R^2$, independently of one another, represent a hydrogen atom or an alkyl or alkoxyalkyl group and $R^3$ represents a hydrogen atom or a methyl or ethyl group, $X^1$ is a straight-chain or branched, saturated hydrocarbon group having 1 to 12 carbon atoms, $X^2$ represents a (c+1)-valent hydrocarbon group from which up to 5 methylene groups may be replaced by oxygen atoms, $D^1$ and $D^2$, independently of one another, denote a saturated hydrocarbon group having 1 to 5 carbon atoms, E represents a divalent saturated hydrocarbon group having 2 to 12 carbon atoms, a divalent 5- to 7-membered, saturated, isocyclic or heterocyclic group, it being possible for the heterocyclic group to contain up to 2 nitrogen, oxygen and/or sulfur atoms in the ring, a divalent, aromatic, mono- or bicyclic, isocyclic group having 6 to 12 carbon atoms or a divalent 5- or 6-membered aromatic heterocyclic group, a is an integer from 0 to 4, b is 0 or 1, c is an integer from 1 to 3, m is an integer from 2 to 4 and n is an integer from 1 to m.

Compounds of this type and processes for their preparation are described in detail in EP-A 0 287 818. If a plurality of radicals R or a plurality of radicals of the structure stated in the square brackets are present in a compound of the general formula I, i.e. if (m−n)>1 or n>1, these radicals may be identical to or different from one another. Compounds of the formula I in which n is m are particularly preferred. All radicals then contain polymerizable groups. The serial number a is preferably 1, and, in the case of a plurality of radicals, a=0 should occur in not more than one radical. If R is an alkyl or hydroxyalkyl group, it generally comprises 2 to 8, in particular 2 to 4, carbon atoms. Aryl radicals R are generally mono- or dinuclear, but preferably mononuclear. They may be substituted by $(C_1\text{-}C_5)$alkyl or $(C_1\text{-}C_5)$alkoxy groups. If $R^1$ and $R^2$ are alkyl or alkoxy groups, they preferably contain 1 to 5 carbon atoms. $R^3$ is preferably a hydrogen atom or a methyl group. $X^1$ is preferably a straight-chain or branched aliphatic and/or cycloaliphatic radical having preferably 4 to 10 carbon atoms. In a preferred embodiment, $X^2$ comprises 2 to 15 carbon atoms. It is in particular a saturated, straight-chain or branched aliphatic and/or cycloaliphatic radical having this number of carbon atoms. Up to 5 methylene groups in these radicals may be replaced by oxygen atoms. If $X^2$ consists of pure hydrocarbon chains, the radical generally comprises 2 to 12, preferably 2 to 6, carbon atoms. $X^2$ may also be a cycloaliphatic group having 5 to 10 carbon atoms, in particular a cyclohexanediyl group. The saturated heterocyclic ring formed by $D^1$, $D^2$ and the two nitrogen atoms generally comprises 5 to 10 ring members, in particular 6 ring members. In the last-mentioned case, the heterocyclic ring is accordingly preferably a piperazine and the radical derived therefrom is a piperazine-1,4-diyl radical. In a preferred embodiment, the radical E is an alkanediyl group which usually comprises about 2 to 6 carbon atoms. The divalent 5- to 7-membered, saturated, isocyclic group E is preferably a cyclohexanediyl group, in particular a cyclohexane-1,4-diyl group. The divalent, isocyclic, aromatic group E is preferably an ortho-, meta- or para-phenylene group. The divalent 5- or 6-membered aromatic heterocyclic group E finally preferably contains nitrogen and/or sulfur atoms in the heterocyclic ring. c is preferably 1, i.e. each of the radicals in the square brackets generally contains only one polymerizable group, in particular only one (meth)acryloyloxy group.

The compounds of the formula I where b=1, which accordingly have two urethane groups in each of the radicals stated in square brackets, can be prepared in a manner known per se by reacting acrylates or alkacrylates which contain free hydroxyl groups with equimolar amounts of diisocyanates. Excess isocyanate groups are then being reacted, for example, with tris(hydroxyalkyl)amines, N,N'-bishydroxyalkylpiperazines or N,N,N',N'-tetrakishydroxyalkylalkylenediamines, it being possible in each case to replace individual hydroxyalkyl groups by alkyl and/or aryl-groups R. Where a=0, a urea group is present. Examples of the hydroxyalkylamines used as starting materials are diethanolamine, triethanolamine, tris(2-hydroxypropyl) amine, tris(2-hydroxybutyl)amine and alkylbishydroxyalkylamines. Examples of suitable diisocyanates are hexamethylene diisocyanate, 2,2,4-trimethylhexamethylene diisocyanate, 1,4-cyclohexylene diisocyanate (=1,4-diisocyanatocylcohexane) and 1,1,3-trimethyl-3-isocyanatomethyl-5-isocyanatocyclohexane. Hydroxyethyl (meth)acrylate, hydroxypropyl (meth)acrylate and hydroxyisopropyl (meth) acrylate are preferably used as esters containing hydroxyl groups.

Polymerizable compounds of the formula I where b=0 can be prepared by reacting the hydroxyalkylamino compounds already described with acrylates or alkacrylates containing isocyanate groups. 2-Isocyanatoethyl (meth)acrylate is preferably used as the ester containing isocyanate groups.

The compounds of the formula II are prepared analogously to those of the formula I, the corresponding glycidyl acrylates or alkacrylates being used instead of reaction products of hydroxyalkyl acrylates or alkacrylates and diisocyanates. Such compounds and processes for their preparation are moreover disclosed in EP-A 0 316 706.

Polymerizable compounds having photooxidizable groups of the formula II $$R_{(m-n)}Q[(—CH_2—CR^1R^2—O)_{a'}—(CH_2—CH[CH_2O—CO—CR^3{=}CH_2]—O)_{b'}—H]_n \quad (II)$$

are suitable for the purposes of the present invention if a' and b' represent integers from 1 to 4 and Q, R, $R^1$, $R^2$, $R^3$, n and m have the abovementioned meanings, it being possible for Q additionally to be a group of the formula >N-E'-N<, in which the radical E' corresponds to the formula III $$—CH_2—CH(OH)—CH_2—[O—(p)C_6H_4—C(CH_3)_2—(p)C_6H_4—CH_2—CH(OH)—CH_2—]_c \quad (III)$$

c having the same meaning as in the formula I and $(p)C_6H_4$ representing para-phenylene.

Furthermore, acrylates and alkacrylates of the formula IV $$Q'[(—X^{1'}—CH_2—O)_a—CO—NH(—X^1—NH—CO—O)_b—X^2—O—CO—CR^3{=}CH_2]_{n'} \quad (IV)$$

in which

Q'=

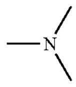 , 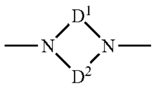 or 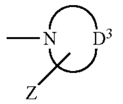

$X^{1'}$ represents $—C_iH_{2i}—$ or $—C_iH_{2i}—$ or $—C_1H_{2i-1}—O—CO—NH(—X^1—NH—CO—O)_b—X^2—O—CO—CR^3{=}CH_2$, $D^3$ represents a saturated hydrocarbon group having 4 to 8 carbon atoms, which forms a 5- or 6-membered heterocycle with the nitrogen atom, Z represents a hydrogen atom or a radical of the formula $C_kH_{2k}—O—CO—NH(—X^1—NH—CO—O)_b—X^2—O—CO—CR^3{=}CH_2$, i and k, independently of one another, are integers from 1 to 12 and n' is an integer from 1 to 3, a being 0 in at least one of the radicals bonded to Q, may be used as polymerizable compounds having photooxidizable groups.

In the formula IV, $X^1$, $R^3$, a and b have the abovementioned meaning; $X^2$ represents a divalent hydrocarbon group in which up to 5 methylene groups may be replaced by oxygen atoms. In this formula, the serial number a is preferably 0 or 1; i is preferably a number from 2 to 10. Preferred radicals Q are piperazine-1,4-diyl ($D^1=D^2=CH_2—CH_2$), piperidin-1-yl ($D^3=[CH_2]_5$, Z=H) and 2-(2-hydroxyethyl)-piperidin-1-yl ($D^3=[CH_2]_5$, $Z=CH_2—CH_2OH$).

Of the compounds of the formula IV, those which also contain at least one urethane group in addition to a urea group are preferred. Once again, a "urea group" is to be understood as meaning the group of the formula >N—CO—N< described further above. Compounds of the formula IV and processes for their preparation are disclosed in EP-A 0 355 387.

Reaction products of mono- and diisocyanates with polyhydric alcohols in which all or some of the hydroxyl groups have been esterified with (meth)acrylic acid are also suitable as polymerizable compounds having photooxidizable groups. Products as formed from the reaction of hydroxyalkyl (meth)acrylates with diisocyanates are preferred. Such monomers are known and are described, for example, in DE-A 28 22 190 or DE-A 20 64 079.

The mixture according to the invention can moreover contain photopolymerizable acrylate and/or alkacrylate compounds having 2 or more, preferably 3 to 6, acrylate and/or alkacrylate groups, in particular methacrylate groups. These polyfunctional compounds act as crosslinking agents. Preferred crosslinking agents are (meth)acrylates of saturated aliphatic or alicyclic, trihydric or polyhydric alcohols, such as alkanediols (especially ethylene glycol and propylene glycol), bisphenol A, trimethylolethane, trimethylolpropane, pentamethylolpropane, pentaerythritol or dipentaerythritol. These are, for example, ethoxylated and propoxylated trimethylolpropane tri(meth)acrylate, ditrimethylolpropane tetra(meth)acrylate, tris(2-hydroxyethyl) isocyanurate tri(meth)acrylate or glyceryl tri(meth)acrylate. The amount of the crosslinking acrylate and/or alkacrylate compounds is in general up to 20% by weight, preferably 5 to 15% by weight, based in each case on the total weight of the nonvolatile components of the radiation-sensitive mixture.

The amount of all photopolymerizable monomers or oligomers is in general 10 to 85% by weight, preferably 20 to 75% by weight, based in each case on the total weight of the nonvolatile components of the radiation-sensitive mixture. In general, at least 40% by weight of the photopolymerizable monomers and/or oligomers are those having photooxidizable groups.

The heptamethinecyanine dye preferably corresponds to one of the general formulae V and VI.

(V)

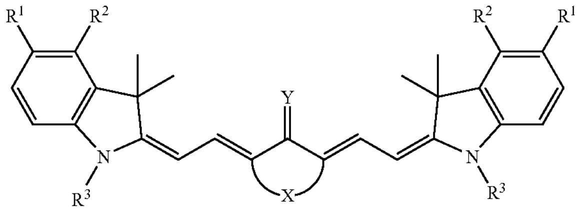

$R^1=R^2$=H or $R^1$ and $R^2$ together denote —CH=CH—CH=CH—, $R^1$ together with $R^2$ forming a six-membered fused ring, $R^3$=methyl, ethyl, propyl or butyl X=—$(CH_2)_3$— or —$(CH_2)_2$—

Y =

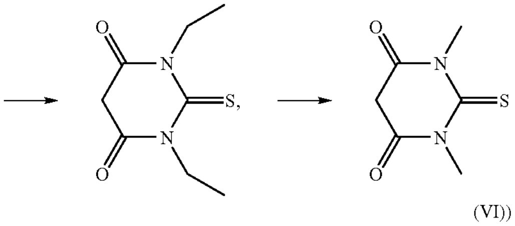

(VI))

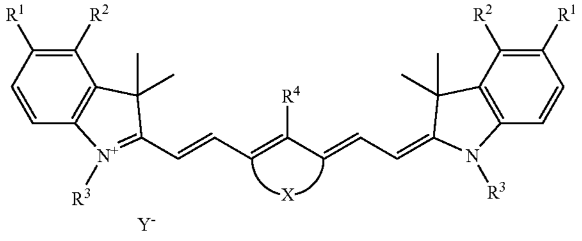

$R^1=R^2$=H or $R^1$ and $R^2$ together denote —CH=CH—CH=CH—, $R^1$ together with $R^2$ forming a six-membered fused ring, $R^3$=methyl, ethyl, propyl or butyl $R^4$=H, Cl,

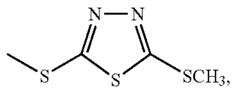,

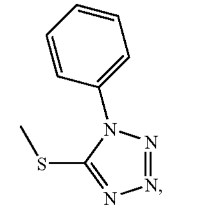,

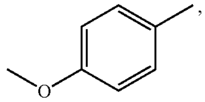,

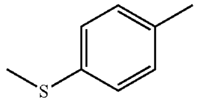

X=—$(CH_2)_3$— or —$(CH_2)_2$—

Y=$Br^-$, $Cl^-$, $I^-$, $pTosO^-$, $ClO_4^-$, $BF_4^-$ or $PF_6^-$

The structure and nomenclature of cyanine dyes are described, inter alia, in H. Zollinger, Color Chemistry, VCH, Weinheim 1991, Nomenclature.

The amount of the heptamethinecyanine dye is in general 0.01 to 10.0% by weight, preferably 0.5 to 8.0% by weight, based in each case on the total weight of the nonvolatile components of the photopolymerizable mixture.

The photoinitiators used in the mixture according to the invention are known per se. Triazine compounds having at least one photolytically cleavable trihalomethyl group, in particular a trichloro- or tribromomethyl group, are suitable. The trihalomethyl group may be bonded directly, via a conjugated double bond or via a chain of conjugated double bonds to an aromatic carbocyclic or heterocyclic ring. Compounds having a triazine parent structure to which in particular 2 trihalomethyl groups are bonded are preferred. Such compounds are disclosed, for example, in DE 2 718 259, EP-A 0 137 452 and EP-A 0 563 925. In principle, the triazines used do not absorb the radiation used for imaging. It is therefore also possible to use trihalomethyltriazines whose self-absorption is below 300 nm. Such materials are particularly preferred because the photoreactivity with respect to the customary interior lighting is thus reduced. Trihalomethyltriazines which may be used are, for example, those which contain (saturated) aliphatic substituents or unsaturated substituents having Π-electron systems which are only slightly extensive and are capable of mesomerism. Compounds having other parent structures, for example phenyl trihalomethyl sulfones (in particular phenyl tribromomethyl sulfone) and phenyl trihalomethyl ketones, which absorb in the short-wave UV range, can in principle also be used. The amount of photoinitiator(s) is in general 0.1 to 20% by weight, preferably 1.0 to 10% by weight, based in each case on the total weight of the nonvolatile components of the photopolymerizable mixture.

Optionally present predispersed phthalocyanine pigments serve primarily for coloring the mixture and the layers produced therewith. Their amount is in general about 1 to 20% by weight, preferably about 2 to 14% by weight. Particularly suitable predispersed phthalocyanine pigments are disclosed in the specifications DE-A 199 15 717 and DE-A 199 33 139. In particular, metal-free phthalocyanine pigments are preferred.

In order better to adapt the properties of the photopolymerizable layer to the respective intended uses, said layer may contain further additives. These are, for example, additives which inhibit thermally induced polymerization, hydrogen donors, dyes, colored and colorless pigments, color formers, filter dyes, indicator dyes, plasticizers and/or chain extenders. Additives chosen are expediently those which do not absorb the radiation having an imagewise action.

For the production of the recording material according to the invention, the radiation-sensitive mixture is expediently dissolved or dispersed in an organic solvent and the solution or dispersion is applied as a thin film to the substrate. The application can be effected by pouring on, spraying or immersion or by application with the aid of rollers or by similar methods known to a person skilled in the art. After drying, a recording material from which, for example, printing plates for letterpress printing, planographic printing, gravure printing or screen printing can be produced is obtained in this manner. It may also be a material from which relief copies (for example for the production of texts in braille), individual copies, tanned images, pigment images or similar imagewise structured products can be produced. The mixture according to the invention is furthermore suitable for the production of etch resists, which can be used, for example, in the production of printed circuit boards or of name tags, and for chemical milling. However, it is preferably used for the production of photoresist layers and of printing plates.

The present invention accordingly also relates to a recording material for the production of printing plates comprising a substrate and a layer of the photopolymerizable mixture according to the invention. Suitable substrate materials for printing plates are foils, strips or plates of metal (in particular of aluminum or of an aluminum alloy, of steel, zinc or copper) or plastic (in particular polyester—especially polyethylene terephthalate—or cellulose acetate) and, for screen printing substrates, also Perlon gauze. In many cases, it is advantageous to subject the surface of the substrate to a mechanical, chemical and/or electrochemical pretreatment in order to establish optimum adhesion between substrate and radiation-sensitive layer or to ensure that the substrate surface reflects the radiation having an imagewise action to a lesser extent (antihalation effect). The preferred substrate for offset printing plates consists of aluminum or of an aluminum alloy and has been electrochemically grained on its surface, then anodized, and optionally also treated with a hydrophilizing agent (for example polyvinylphosphonic acid).

Because of the sensitivity of the recording material according to the invention in the near infrared (NIR) range, the IR laser sources between 700 and 1 200 nm which are familiar to a person skilled in the art are used for the imagewise exposure. Laser diodes which emit in the NIR range are preferred.

The recording material according to the invention has a particularly high imaging power and is therefore particularly suitable for digital imaging by means of NIR laser beams. In the following development process, exact differentiation between nonimage areas and image areas is then produced so that the increase in dot area is surprisingly substantially reduced. Negative inscriptions are therefore also clearly reproduced. At the same time, the material has very high sensitivity in the NIR wavelength range.

It is virtually indispensable that the radiation-sensitive layer be protected from the action of atmospheric oxygen during the polymerization induced by NIR radiation. This can be most simply achieved by means of a top layer which is impermeable or only slightly permeable to oxygen ("slightly permeable" means permeability of not more than 100 $cm^3$ $O_2/m^2 \cdot d \cdot bar$, determined according to DIN 53 580 at 23° C.) and which is applied to the radiation-sensitive layer. The top layer may be self-supporting and may be peeled off before the subsequent development step. It then consists, for example, of a polyester film applied by lamination. Top layers comprising a material which (at least in the uncured parts) is soluble or dispersible in the developer liquid can also be used. Suitable materials for a top layer completely soluble in aqueous alkaline developers are, for example, polyvinyl alcohol, polyvinylpyrrolidone, polyphosphates, sugar, etc. The thickness of the top layer is in general 0.1 to 10 μm, preferably 1 to 5 μm.

The further processing of the imagewise exposed recording materials is effected by generally customary methods known to a person skilled in the art. Before the development, the imagewise exposed material can also be subsequently heated in order to achieve better crosslinking in the exposed parts. For the development itself, organic solvents or mixtures of organic solvents can be used, but aqueous alkaline solutions which have a pH of 8 to 14, in particular of 9 to 13, and may contain up to 20% by weight, preferably up to 15% by weight, of water-miscible organic solvents are preferred. The developers can moreover contain wetting agents, dyes, salts and/or other additives. During the development, the unexposed parts of the layer are removed while the exposed and hence cured parts of the layer remain behind on the substrate.

The following examples illustrate the invention. Therein, "pbw" represents "part(s) by weight", and "pbv" represents "part(s) by volume". Percentages are by weight, unless stated otherwise or evident from the context.

EXAMPLE 1

A mixture of 6.92 pbw of a 32.8% strength solution of methyl methacrylate/methacrylic acid copolymer (molar ratio of methyl methacrylate to methacrylic acid units 4:1; acid number: 110 mg KOH/g) in 2-butanone (viscosity of the solution 105 $mm^2/s$ with capillary size 1.0 at 25° C.), 3.77 pbw of an 86.8% strength solution of a reaction product of 1 mol of 2,2,4-trimethylhexamethylene diisocyanate and 2 mol of hydroxyethyl methacrylate (viscosity: 3.3 $mm^2/s$ with capillary size 1.0 at 25° C.), 0.16 pbw of IR dye FEW S0094 (=formula VI, $R^1$ and $R^2$ together denote —CH═CH—CH═CH—, and R together with $R^2$ forms a six-membered fused ring, $R^3$=$CH_3$, R=Cl, X=$(CH_2)_3$ and Y=pTos$O^-$, 6.87 pbw of Heliogen Blue D 7490 dye dispersion (cf. DE 199 33 139 Al) (9.9% strength, viscosity 7.0 $mm^2/s$ with capillary size 1 at 25° C.), 0.41 pbw of 2,4-bistrichloromethyl-6-biphenyl-4-yl[1,3,5]triazine, 0.68 pbw of Edaplan™ LA 411 (1% strength in ®Dowanol PM), 20.5 pbw of 2-butanone and 40.7 pbw of propylene glycol monomethyl ether (®Dowanol PM)

was applied by spin-coating to an electrochemically grained, anodized (oxide weight 3 $g/m^2$) aluminum printing plate substrate hydrophilized with polyvinylphosphonic acid and was dried at 100° C. for 2 min in a through-circulation drier. The layer thickness of the radiation-sensitive layer was 1.58 $g/m^2$. A 6% strength aqueous solution of a mixture of 1 pbw of completely hydrolyzed polyvinyl alcohol (degree of hydrolysis 98.4%, viscosity 4 mPa.s in 4% strength aqueous solution at 20° C.), 1 pbw of partly hydrolyzed polyvinyl alcohol (degree of hydrolysis 87.7%, viscosity 8 mPa.s in 4% strength aqueous solution at 20° C.) and 0.5 pbw of polyvinylpyrrolidone (k value=30) was applied to the radiation-sensitive layer and likewise dried for 2 min at 100° C. in circulated air. The top layer had a layer weight of 1.47 g/$m^2$.

The printing plate thus obtained was provided with an image using a CREO Trendsetter 3244T (2 400 dpi), heated to 100° C. for 1 min and then developed (Agfa VSP85) with an aqueous alkaline developer (Agfa EN 231C) at 28° C. at a speed of passage of 1 m/min. The stated sensitivity corresponded to that laser energy in the image plane which was required to enable a 50% field formed from 1×1 and 8×8 dots to appear uniformly bright. The value determined in this manner was 18 mJ/$cm^2$.

EXAMPLE 2 AND COMPARATIVE EXAMPLES C1 TO C4

Further printing plates were produced as described in example 1, the following components being used for the IR-sensitive layer:

A a 32.8% strength solution of a methyl methacrylate/methacrylic acid copolymer (molar ratio of methyl methacrylate to methacrylic acid units 4:1; acid number: 110 mg KOH/g) in 2-butanone (viscosity 105 $mm^2$/s at capillary size 1.0 and 25° C.)

B an 86.8% strength solution of a reaction product of 1 mol of 2,2,4-trimethylhexamethylene diisocyanate and 2 mol of hydroxyethyl methacrylate (viscosity 3.3 $mm^2$/s at capillary size 1.0 and 25° C.)

C dipentaerythrityl pentaacrylate (Cray Valey SR 399)

D ethoxylated trimethylolpropane triacrylate (Cray Valey SR 454)

E trimethylolpropane triacrylate

F bisphenol A dimethacrylate

G R dye FEW S0094 (=formula VI, $R^1$ and $R^2$ together denote —CH═CH—CH═CH—, and $R^1$ together with $R^2$ forms a six-membered fused ring, $R^3$=$CH_3$, $R^4$=Cl, X=$(CH_2)_3$ and $Y^-$=pTos$O^-$ (=para-toluene sulfonate)

H Heliogen Blue D 7490 dye dispersion (cf. DE 199 33 139 Al) (9.9% strength, viscosity 7.0 $mm^2$/s with capillary size 1.0 at 25° C.)

I 2,4-bistrichloromethyl-6-biphenyl-4-yl[1,3,5]triazine

J 2-mercaptobenzothiazole

K Edaplan™ LA 411 (1% strength in ®Dowanol PM)

L 2-butanone

M propylene glycol monomethyl ether ®Dowanol PM)

The composition used in each case, layer weights and plate sensitivity determined are listed in table 1:

TABLE 1

| | Examples | | | | |
|---|---|---|---|---|---|
| Component | 2 pbw | C1 pbw | C2 pbw | C3 pbw | C4 pbw |
| A | 6.900 | 6.904 | 6.904 | 6.904 | 6.904 |
| B | 3.770 | — | — | — | — |
| C | — | 3.270 | — | — | — |
| D | — | — | 3.270 | — | — |
| E | — | — | — | 3.270 | — |
| F | — | — | — | — | 3.270 |
| G | 0.163 | 0.163 | 0.163 | 0.163 | 0.163 |
| H | 6.870 | 6.869 | 6.869 | 6.869 | 6.869 |
| I | 0.408 | 0.408 | 0.408 | 0.408 | 0.408 |
| J | 0.007 | 0.007 | 0.007 | 0.007 | 0.007 |
| K | 0.680 | 0.679 | 0.679 | 0.679 | 0.679 |

TABLE 1-continued

| | Examples | | | | |
|---|---|---|---|---|---|
| Component | 2 pbw | C1 pbw | C2 pbw | C3 pbw | C4 pbw |
| L | 20.48 | 20.98 | 20.98 | 20.98 | 20.98 |
| M | 40.72 | 40.72 | 40.72 | 40.72 | 40.72 |
| Layer weight [g/$m^2$] | 1.60 | 1.50 | 1.50 | 1.30 | 1.50 |
| Energy value mJ/$cm^2$] | 42 | 109 | —1) | 117 | 90 |

1)In the investigated energy range of 18 to 110 mJ/$cm^2$, no curing was observed

EXAMPLE 3

A printing plate was produced, as described under example 1, from a mixture of 2.92 pbw of a 32.8% strength solution of a methyl methacrylate/methacrylic acid copolymer (molar ratio of methyl methacrylate to methacrylic acid units 4:1; acid number 110 mg KOH/g) in 2-butanone (viscosity 105 $mm^2$/s at capillary size 1.0 and 25° C.)

6.99 pbw of a 28.9% strength solution of a reaction product of 1 mol of hexamethylene diisocyanate, 1 mol of hydroxyethyl methacrylate and 0.5 mol of 2-(2-hydroxyethyl)piperidine (viscosity 1.7 $mm^2$/s with capillary size 1.0 at 25° C.), 0.10 pbw of IR dye FEW S0094 (=formula VI, $R^1$ and $R^2$ together denote —CH═CH—CH═CH—, and R together with $R^2$ forms a six-membered fused ring, $R^3$=$CH_3$, $R^4$=C1, X=$(CH_2)_3$ and $Y^-$=pTos$O^-$), 3.37 pbw of Heliogen Blue D 7490 dye dispersion (cf. DE 199 33 139 Al) (9.9% strength, viscosity 7.0 $mm^2$/s with capillary size 1.0 at 25° C.), 0.41 pbw of 2,4-bistrichloromethyl-6-biphenyl-4-yl[1,3,5]triazine, 0.67 pbw of Edaplan™ LA 411 (1% strength in ®Dowanol PM), 19.4 pbw of 2-butanone and 36.1 pbw of propylene glycol monomethyl ether ®Dowanol PM).

The layer weight of the IR sensitive layer was 1.2 g/$m^2$. With the further processing described above, an energy value of less than 20 mJ/$cm^2$ was obtained.

EXAMPLES 4 TO 8

IR-sensitive printing plates were produced as in example 1 from the following components:

A a 32.8% strength solution of a methyl methacrylate/methacrylic acid copolymer (molar ratio of methyl methacrylate to methacrylic acid units 4:1; acid number: 110 mg KOH/g) in 2-butanone (viscosity 105 $mm^2$/s with capillary size 1.0 at 25° C.)

B IR dye FEW S0325 (=formula V, $R^1$ and $R^2$ together denote —CH═CH—CH═CH—, and $R^1$ together with $R^2$ forms a six-membered fused ring, $R^3$=$CH_3$, Y=N-methylbarbituryl, X=$(CH_2)$2)

C IR dye FEW S0507 (=formula VI, $R^1$, $R^2$=H, $R^3$=$CH_3$, $R^4$=1-phenyl-5-thio[1,2,3,4]tetrazolyl, X=$(CH_2)_3$ and $Y^-$=chloride D IR dye FEW S0331 (=formula V, $R^1$ and $R^2$ together denote —CH═CH—CH═CH—, and $R^1$ together with $R^2$ forms a six-membered fused ring, $R^3$=$CH^3$, Y=N-ethylthiobarbituryl, X=$(CH_2)_2$)

E IR dye FEW S0382 (=formula VI, $R^1$, $R^2$=H, $R^3$=$CH_3$, $R^4$=5-methylsulfanyl[1,3,4]thiadiazol-2-ylsulfanyl, X=$(CH_2)_2$ and Y=$ClO_4^-$ F IR dye FEW S0367 (=formula VI, $R^1$, $R^2$=H, $R^3$=$CH_3$, $R^4$=5-methylsulfanyl[1,3,4]thiadiazol-2-ylsulfanyl, X=$(CH_2)_3$ and $Y^-$=$ClO_4^-$ G an 86.8% strength solution of a reaction product of 1 mol of 2,2,4-trimethylhexamethylene diisocyanate and 2 mol of 2-hydroxyethyl methacrylate (viscosity 3.3 $mm^2$/s with capillary size 1.0 at 25° C.)

H Heliogen Blue D 7490 dye dispersion (cf. DE 199 33 139 A1) (9.9% strength, viscosity 7.0 $mm^2$/s with capillary size 1.0 at 25° C.)

I 2,4-bistrichloromethyl-6-biphenyl-4-yl[1,3,5]triazine

J 2-mercaptobenzothiazole

K ®Edaplan LA 411 (1% strength in ®Dowanol PM)

L 2-butanone

M propylene glycol monomethyl ether (®Dowanol PM)

The composition used in each case, the layer weights and the plate sensitivities determined are listed in table 2:

TABLE 2

| | Examples | | | | |
|---|---|---|---|---|---|
| Component | 4 pbw | 5 pbw | 6 pbw | 7 pbw | 8 pbw |
| A | 6.430 | 6.430 | 6.430 | 8.090 | 8.110 |
| B | 0.095 | — | — | — | — |
| C | — | 0.095 | — | — | — |
| D | — | — | 0.101 | — | — |
| E | — | — | — | 0.130 | — |
| F | — | — | — | — | 0.120 |
| G | 3.310 | 3.310 | 3.310 | 4.170 | 4.170 |
| H | 6.390 | 6.290 | 6.160 | 7.760 | 7.760 |
| I | 0.238 | 0.238 | 0.238 | 0.300 | 0.300 |
| J | 0.018 | 0.018 | 0.018 | 0.020 | 0.020 |
| K | 0.600 | 0.600 | 0.600 | 0.760 | 0.760 |
| L | 17.67 | 17.67 | 17.98 | 51.04 | 51.02 |
| M | 35.35 | 35.35 | 35.48 | 77.74 | 77.74 |
| Layer weight [$g/m^2$] | 1.50 | 1.50 | 1.66 | 1.10 | 1.10 |
| Energy value [$mJ/cm^2$] | 28 | 38 | 61 | 43 | 57 |

I claim:

1. A radiation-sensitive mixture comprising an acrylate or methacrylate monomer and/or oligomer, the monomer and/or oligomer comprising at least two acrylate and/or methacrylate groups and at least one photooxidizable group, a photoinitiator, an IR-absorbing dye and an organic polymeric binder, the radiation-sensitive mixture being capable of radical polymerization upon exposure to near IR light, the near IR light ranging from 700 to 1200 nm, wherein the IR-absorbing dye is a heptamethinecyanine dye, wherein the photoinitiator is selected from the group consisting of phenyl trihalomethyl sulfones and phenyl trihalomethyl ketones, and wherein the photoinitiator does not absorb near IR light.

2. The mixture of claim 1, wherein 3 methine carbon atoms in the main methine chain of the dye are part of a 5- to 7-membered isocyclic or heterocyclic ring.

3. The mixture of claim 1, wherein the two aromatic terminal groups in the heptamethinecyanine dyes are indole and/or indolium groups with which optionally at least one further ring may also be fused.

4. The mixture of claim 1, wherein the heptamethinecyanine dye corresponds to the formula V (V)

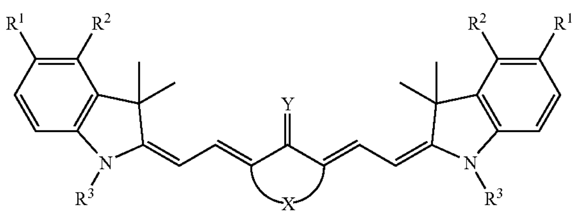

$R^1$=$R^2$=H or $R^1$ and $R^2$ together denote —CH=CH—CH=CH—, $R^1$ together with $R^2$ forming a six-membered fused ring, $R^3$ denotes methyl, ethyl, propyl or butyl X denotes —$(CH_2)_3$— or —$(CH_2)_2$—

Y denotes

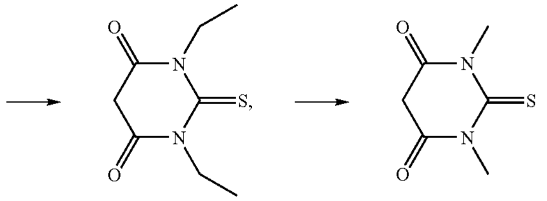

or the formula VI (VI)

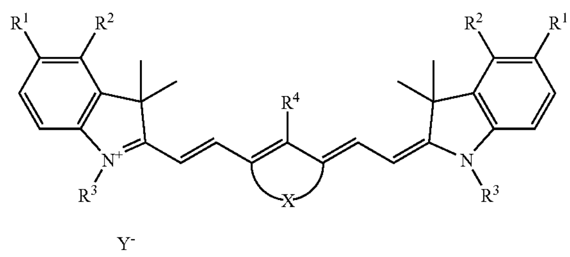

$R^1$=$R^2$=H or $R^1$ and $R^2$ together denote —CH=CH—CH=CH—, $R^1$ together with $R^2$ forming a six-membered fused ring, $R^3$=methyl, ethyl, propyl or butyl $R^4$=H, Cl,

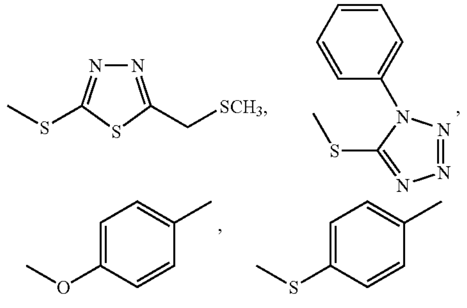

$X = -(CH_2)_3-$ or $-(CH_2)_2-$ $Y = Br^-$, $Cl^-$, $I^-$, $pTosO^-$, $ClO_4^-$, $BF_4^-$ or $PF_6^-$.

5. The mixture of claim 1, wherein the amount of the heptamethinecyanine dye is 0.01 to 10% by weight based on the total weight of the nonvolatile components of the mixture.

6. The mixture of claim 1, wherein the acrylate or methacrylate monomer contains two acrylate or methacrylate groups.

7. The mixture of claim 6, wherein the photooxidizable group in the acrylate or methacrylate monomer or oligomer is a primary, secondary or tertiary amino group, a urea group, a thio group and/or a urethane group.

8. The mixture of claim 1, wherein the amount of all photopolymerizable monomers or oligomers is 10 to 85% by weight based on the total weight of the nonvolatile components of the mixture.

9. The mixture of claim 8, wherein the amount of photopolymerizable monomers or oligomers having photooxidizable groups is at least 40% by weight based on the total weight of all photopolymerizable monomers and/or oligomers.

10. The mixture of claim 1, wherein the photoinitiator is a triazine compound having two trichloromethyl groups.

11. The mixture of claim 1, wherein the amount of photoinitiator(s) is 0.1 to 20% by weight based on the total weight of the nonvolatile components of the mixture.

12. The mixture of claim 1, wherein chlorinated polyalkylenes, alkyl or alkenyl poly(meth)acrylates, alkyl (meth) acrylate/(meth)acrylic acid copolymers, copolymers of alkyl or alkenyl (meth)acrylates with other copolymerizable monomers, polyvinyl chloride (PVC), vinyl chloride/acrylonitrile copolymers, polyvinylidene chloride (PVDC), vinylidene chloride/acrylonitrile copolymers, polyvinyl acetate, polyvinyl alcohol, polyacrylonitrile, acrylonitrile/styrene copolymers, (meth)acrylamide/alkyl (meth)acrylate copolymers, acrylonitrile/butadiene/styrene (ABS) terpolymers, polystyrene, poly($\alpha$-methylstyrene), polyamides, polyurethanes, polyesters, methylcellulse, ethylcellulose, acetylcellulose, (hydroxy-($C_1$-$C_4$)alkyl)cellulose, carboxymethylcellulose, polyvinylformal and/or polyvinylbutyral and $\alpha,\beta$-unsaturated carboxylic or dicarboxylic acids are used as the binder.

13. The mixture of claim 1, wherein the binder has an average molecular weight $M_w$ of 600 to 2000 and an acid number between 10 and 250 or a hydroxyl number of 50 to 750.

14. The mixture of claim 1, wherein the amount of the binder or binders is 10 to 90% by weight based on the total weight of the nonvolatile components of the mixture.

15. A recording material for the production of printing plates comprising a substrate and a layer of the photopolymerizable mixture, the photopolymerizable mixture comprising an acrylate or methacrylate monomer and/or oligomer, the monomer and/or oligomer comprising at least two acrylate and/or methacrylate groups and at least one photooxidizable group, a photoinitiator, an IR-absorbing dye and an organic polymeric binder, the radiation-sensitive mixture being capable of radical polymerization upon exposure to near IR light, the near IR light ranging from 700 to 1200 nm, wherein the IR-absorbing dye is a heptamethinecyanine dye, wherein the photoinitiator is selected from the group consisting of phenyl trihalomethyl sulfones and phenyl trihalomethyl ketones, and wherein the photoinitiator does not absorb near IR light.

16. The recording material of claim 15, wherein the substrate is a foil, a strip or a sheet of plastic or metal.

17. The recording material of claim 15, wherein a top layer which is impermeable or only slightly permeable to oxygen is present on the radiation-sensitive layer.

18. The recording material of claim 17, wherein the top layer consists of polyvinyl alcohol, polyvinylpyrrolidone, polyphosphates or a sugar.

19. The recording material of claim 17, wherein the top layer has a thickness of 0.1 to 10 μm.

20. A process for the production of a printing plate comprising providing a recording material comprising a substrate and a layer of a photopolymerizable mixture, the photopolymerizable mixture comprising an acrylate or methacrylate monomer and/or oligomer, the monomer and/or oligomer comprising at least two acrylate and/or methacrylate groups and at least one photooxidizable group, a photoinitiator, an IR-absorbing dye and an organic polymeric binder, the radiation-sensitive mixture being capable of radical polymerization upon exposure to near IR light, the near IR light ranging from 700 to 1200 nm, wherein the IR-absorbing dye is a heptamethinecyanine dye, wherein the photoinitiator is selected from the group consisting of phenyl trihalomethyl sulfones and phenyl trihalomethyl ketones, and wherein the photoinitiator does not absorb near IR light, imagewise exposing the recording material to IR laser beams having a wavelength between 700 and 1200 nm, and developing the imagewise exposed recording material with an organic solvent or solvent mixture or an aqueous alkaline solution.

21. The mixture of claim 1, wherein the photoinitiator is a phenyl trihalomethyl sulfone.

* * * * *